United States Patent [19]

Cambou et al.

[11] Patent Number: 5,389,569
[45] Date of Patent: Feb. 14, 1995

[54] VERTICAL AND LATERAL ISOLATION FOR A SEMICONDUCTOR DEVICE

[75] Inventors: Bertrand F. Cambou; Donald L. Hughes, both of Mesa, Ariz.

[73] Assignee: Motorola, Inc., Schaumburg, Ill.

[21] Appl. No.: 845,409

[22] Filed: Mar. 3, 1992

[51] Int. Cl.⁶ .............................................. H01L 21/76
[52] U.S. Cl. ..................................... 437/67; 437/927; 437/61; 437/154
[58] Field of Search ............... 148/DIG. 12, DIG. 85, 148/DIG. 86, DIG. 50, DIG. 73; 437/62, 67, 61, 927, 159; 257/501

[56] References Cited

U.S. PATENT DOCUMENTS

| | | | |
|---|---|---|---|
| 4,631,803 | 12/1986 | Hunter et al. | 148/DIG. 12 |
| 4,638,552 | 1/1987 | Shinbo et al. | 148/DIG. 12 |
| 4,710,794 | 12/1987 | Koshino et al. | 257/501 |
| 4,881,115 | 11/1989 | Lesk et al. | 257/501 |
| 5,204,282 | 4/1993 | Tsurata et al. | 148/DIG. 12 |

FOREIGN PATENT DOCUMENTS 272642  3/1950  Japan .
3265154 11/1991  Japan .

OTHER PUBLICATIONS

Haisma J., et al, "Silicon on Insulator... Evaluations", Japanese J. Appl. Phys. vol. 28, No. 8 (1989), pp. 1426–1443.

Primary Examiner—George Fourson
Attorney, Agent, or Firm—Gary F. Witting; Eugene A. Parsons

[57] ABSTRACT

A method is provided for making a power device (54) and a small signal device (52) on a bonded silicon substrate (41). A first silicon substrate (10) provided. A first surface (17) is etched to form a plurality of cavities (11) with a depth (13). A dielectric layer (14) is created on the first surface (17), wherein the dielectric layer (14) is created with a thickness less than or equal to the depth of the plurality of cavities. The dielectric layer (14) is patterned so that a plurality of islands (22) of dielectric remain in the cavities. A second silicon substrate (42) is provided. The first and the second silicon substrates (10, 42) are bonded together in such a manner that the islands (22) are buried. A predetermined portion of the first silicon substrate (10) is removed, thereby creating a surface that is suitable for semiconductor device fabrication.

17 Claims, 2 Drawing Sheets

VERTICAL AND LATERAL ISOLATION FOR A SEMICONDUCTOR DEVICE

BACKGROUND OF THE INVENTION

This invention relates, in general, to fabrication of semiconductor devices and, more particularly, to fabrication of vertical and lateral isolated semiconductor devices on bonded wafers.

At the present, fabrication of semiconductor devices using buried oxide or in conjunction with wafer bonding is not effective for several reasons, such as complex processing, planarization of a deposited dielectric layer, difficulties of bonding together two semiconductor wafers, and high cost.

As practiced by one method in the prior art, a first semiconductor substrate, made of silicon, is etched to form a plurality of cavities in the semiconductor substrate. These cavities are formed in the semiconductor substrate by any number of processes well known in the art. Generally, a dielectric material such as oxide is then applied to the semiconductor substrate in such a manner that the dielectric material completely fills the plurality of cavities. As a result of the dielectric material completely filling the etched plurality of cavities, surfaces surrounding the plurality of cavities are covered with dielectric material as well. The dielectric material is then planarized; however, planarizing with conventional methods results in several problems, such as particles on the surface of the semiconductor substrate, non-uniformity of the planarized dielectric material, and a high cost of processing the semiconductor substrate through the planarizing processes. The first semiconductor substrate is then bonded to a second semiconductor substrate; however, in bonding the first and second semiconductor substrates together, having the dielectric material cover the surfaces surrounding the plurality of cavities in the first semiconductor substrate, as previously discussed, results in still further problems in the bonding of the two semiconductor substrates. Typically, the problems in bonding the two semiconductor wafers together result in large and small voids between the two semiconductor wafers, which can lead to delamination of the two semiconductor substrates. The delamination of the two semiconductor substrates is a catastrophic defect and removes the two semiconductor substrates from use. Generally, the second semiconductor substrate is then polished back to a suitable thickness, thereby providing buried oxide material under the second semiconductor substrate.

Alternatively, in another method used in the prior art, a dielectric material, such as oxide, is applied or grown on a first silicon substrate. The dielectric material is selectively etched, thereby creating a plurality of openings to the silicon substrate, as well as a plurality of dielectric islands on the silicon substrate. Subsequently, the silicon substrate is processed through a selective epitaxial deposition, wherein silicon is epitaxially and selectively formed in the openings between the islands of oxide on the first semiconductor substrate. However, selective epitaxial deposition is a difficult process to control, and does not form a smooth bondable surface that is planar with the dielectric material. Thus, the epitaxially deposited material must be planarized as previously discussed, thereby resulting in similar problems.

Additionally, it should be noted that formation of the buried dielectric material in both of the methods discussed hereinbefore results in stress being created in the first silicon substrate. This stress is further aggravated by a difference in thermal coefficients of expansion between the dielectric material and a semiconductor substrate when subsequent thermal processing is done.

It can be readily seen that conventional methods for making buried oxide in conjunction with wafer bonding have severe limitations. Also, it is evident that the conventional processes that are used to fabricate buried dielectric materials in conjunction with wafer bonding are not only complex and expensive, but also are not effective processes. Therefore, a method for making a buried dielectric layer that provides vertical and lateral isolation for a semiconductor device on a bonded wafer would be highly desirable.

SUMMARY OF THE INVENTION

Briefly stated, a method is provided for making a power device and a small signal device on a single silicon substrate. A first silicon substrate with a first and a second surface is provided. The first surface on the first silicon substrate is etched to form a plurality of cavities with a depth. A dielectric layer is created on the first surface of the first silicon substrate, wherein the dielectric layer is created with a thickness less than or equal to the depth of the plurality of cavities. The dielectric layer is patterned in such a manner that a plurality of islands of dielectric remain in the plurality of cavities. A second silicon substrate with a first and a second surface is provided. The first and the second silicon substrates are bonded together in such a manner that the first surface of the first silicon substrate is mated with the first surface of the second silicon substrate, burying the islands of dielectric. A predetermined portion of the first silicon substrate is removed from the second surface, thereby creating a surface that is suitable for semiconductor device fabrication. A fabrication sequence for making the small signal and the power device is then completed, wherein the small signal device is made over the buried islands of dielectric and the power device is made over an active substrate area.

DETAILED DESCRIPTION OF THE DRAWINGS

Figure 1:
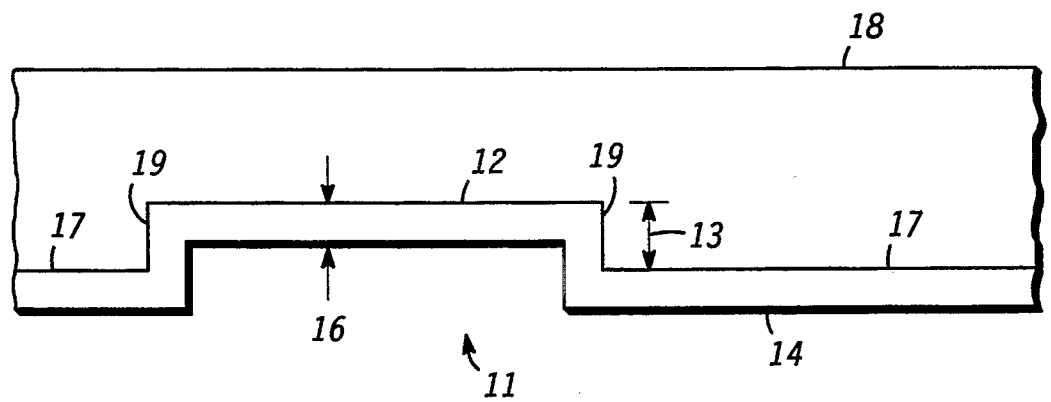
FIG. 1 is a simplified cross-sectional view of a portion of a first silicon substrate in accordance with the present invention.

FIG. 1 is a simplified cross-sectional view of a portion of a silicon substrate 10 with a cavity 11 and a layer 14, which covers both cavity 11 and a first surface 17 of silicon substrate 10. It should be understood that only a small portion of silicon substrate 10 and only one cavity 11, of which many cavities can be made on silicon substrate 10, are shown. In the present invention, a combination of well-known processes is described that allows for a novel vertical and lateral isolation of a first and a second semiconductor device.

Generally, silicon substrate 10 is made of either n-type or p-type silicon material; however, in a preferred embodiment of the present invention n-type silicon material is used. Additionally, silicon substrate 10 is prepared with a surface 17 and a surface 18, wherein surface 17 is polished to a smooth mirror surface and surface 18 is typically smooth but not mirror finished.

Cavity 11, which illustrates one of a plurality of cavities located in silicon substrate 10, is made by a number of well-known methods in the semiconductor art. Typically, cavity 11 is made by preparing surface 17 of silicon substrate 10 photolithographically with a photoresist mask (not shown). The photoresist mask provides openings to silicon substrate 10, thereby allowing etching of silicon substrate 10, while other areas, such as surface 17, are protected by the photoresist mask and not allowed to be etched. The etching of cavity 11 is accomplished by any number of well-known methods in the art, such as wet-etching or dry-etching techniques. It should be understood that by selecting either wet-etching or dry-etching techniques that a profile of sidewalls 19 leading to a bottom surface 12 of cavity 11 is varied, depending upon process parameters. For example, wet-etching techniques generally are isotropic, thus yielding a curved profile, whereas dry-etching techniques generally are anisotropic, thus producing a vertical profile. Depth 13 of cavity 11 ranges from 0.5 micron to 3.0 microns, with a preferred depth on an order of 1.5 microns; however, depth 13 of cavity 11 is determined by specific applications, thus depth 13 has a wide range of values. Once cavity 11 has been suitably etched, the patterning or masking material is completely removed by any number of combinations of well-known methods in the art, such as dry plasma stripping, solvent stripping, and wet chemical stripping.

In a preferred embodiment of the present invention, layer 14 is a dielectric, such as silicon dioxide, silicon nitride, spin-on glass, or the like. Typically, layer 14 is created on a surface of silicon substrate 10, thus covering all exposed surfaces, such as surface 17, sidewalls 19, and bottom surface 12. Thickness 16 of layer 14 is controlled so that thickness 16 is less than or equal to depth 13 of cavity 11.

Figure 2:
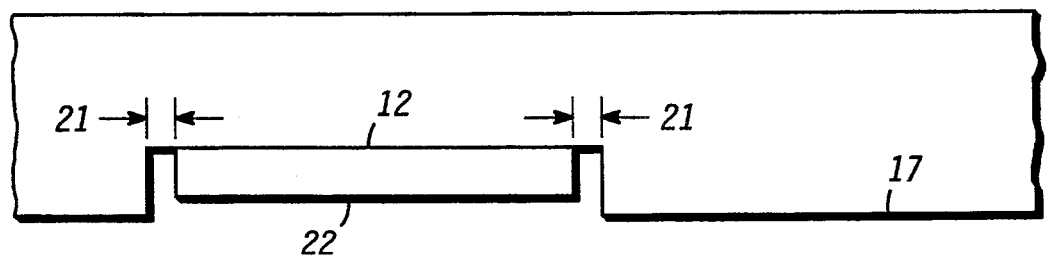
FIG. 2 is a simplified cross-sectional view of the FIG. 1 substrate further along in the process of the present invention.

FIG. 2 is a simplified cross-sectional view of silicon substrate 10, with layer 14 partially removed. Typically, layer 14 is removed by well-known processes of photolithography and etching as described hereinbefore. Briefly, a photolithographic pattern is generated on layer 14, which exposes layer 14 that is located on surface 17 of silicon substrate 10. A photoresist pattern or island covers or protects layer 14, which is on bottom surface 12 of cavity 11. Etching of patterned silicon substrate 10 results in removal of layer 14 everywhere except in cavity 11. Additionally, in a preferred embodiment of the present invention, photoresist patterning and etching are adjusted so as to result in spaces 21 on either side of remaining layer or island 22, thus providing a mechanism for stress relief upon subsequent thermal processing. Once layer 14 is completely etched, the patterning or masking material is completely removed, as previously described hereinbefore.

Figure 3:
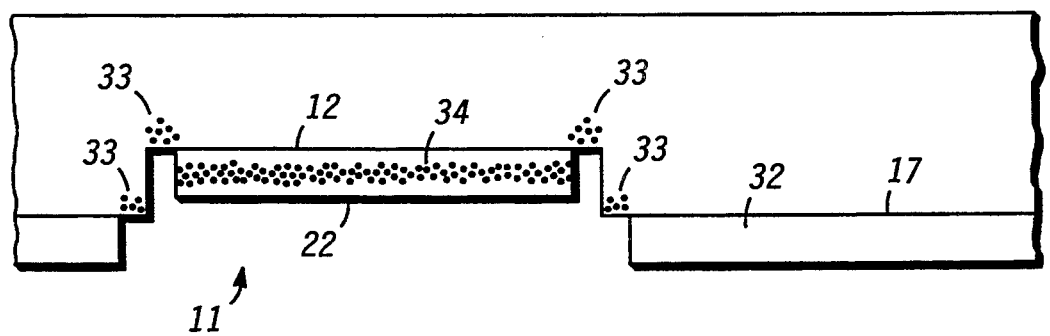
FIG. 3 is a simplified cross-sectional view of the FIG. 2 substrate illustrating a selective implantation of ions in partial preparation of the present invention.

FIG. 3 is a simplified cross-sectional view of ions 31 being selectively implanted into silicon substrate 10. Generally, silicon substrate 10 is prepared by using well-known photolithography methods, which selectively expose cavity 12 and regions 21, while masking layer 32 protects or covers surface 17 of silicon substrate 10, preventing ions from being implanted into surface 17.

Once silicon substrate 10 is photolithographically prepared, silicon substrate 10 is ion implanted by well-known methods in the art. Implantation of ions 31 into the exposed areas of silicon substrate 10 create implanted ions 33 in exposed silicon substrate 10 and implanted ions 34 in remaining layer 22. It should be understood that remaining layer or island 22 prevents implanted ions 34 from reaching the bottom surface 12 of cavity 11, thus remaining layer 22 acts as an effective masking layer. It should be further understood that masking layer 32 also prevents ions 31 from reaching surface 17 of silicon substrate 10. Implanted ions are of either p-type, such as boron or n-type, such as arsenic, phosphorus, or antimony; however, it should be understood that selection of implanted ion type is application specific. In a preferred embodiment of the present invention, boron ions are implanted into n-type silicon substrate 10. Typically, implanted doses range from $10^{11}$ ions per square centimeter to $10^{19}$ ions per square centimeter; however, in a preferred embodiment of the present invention a range from $10^{13}$ ions per square centimeter to $10^{14}$ ions per square centimeter is used. After ion implantation has been completed, masking layer 32 is removed by well-known methods in the art, as previously describe hereinbefore.

In another embodiment of the present invention, layer 14, as shown in FIG. 1, is not made. However, in such an embodiment of the present invention, masking layer 32 is patterned to provide masking protection for bottom surface 12, while still creating spaces 21 as shown in FIG. 2, thus allowing implantation of implanted ions 33, without using remaining layer 22 to block the ions directed toward silicon substrate 10. Additionally, implantation of ions 31 and stripping of masking layer 32 are accomplished, as previously described.

Figure 4:
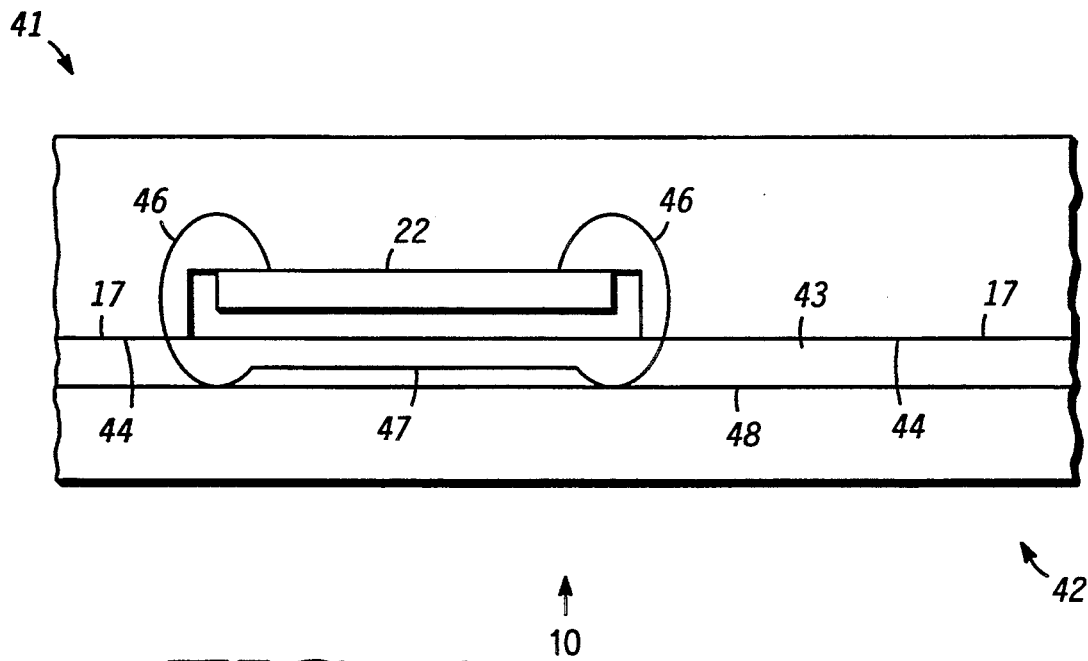
FIG. 4 is a simplified cross-sectional view of the FIG.3 substrate bonded to a second silicon substrate.

FIG. 4 is a simplified cross-sectional view of a bonded wafer 41, which is made of silicon substrate 10 and silicon substrate 42. In a preferred embodiment of the present invention, silicon substrate 42 is prepared by well-known methods, providing a silicon layer 43 which is epitaxially grown on silicon substrate 42. Typically, silicon layer 43 is an n-type that is doped with arsenic or phosphorus to a concentration range from $10^{14}$ ions per square centimeter to $10^{16}$ ions per square centimeter, with a preferred dopant being arsenic with a concentration of $10^{15}$. However, it should be understood that in some applications it is not necessary to provide silicon substrate 42 with silicon layer 43.

Once silicon substrate 42 has been prepared, silicon substrate 42 and silicon substrate 10 are bonded together by well-known methods in the art. Typically, bonding of surface 17 of silicon substrate 10 and surface 44 of silicon substrate 42 requires that both surfaces be clean and particle free prior to bonding. After cleaning, surface 17 and surface 44 are brought together and mated, thus creating bonded wafer 41.

Additionally, in the present invention, defect-free bonding is enhanced between surface 44 and surface 17. It is believed that enhanced bonding occurs because the plurality of cavities 11 provides a place for air bubbles during the mating process, thus not trapping the air bubbles between surfaces 17 and 44.

Bonded wafer 41 is subsequently heat treated in a temperature range between 900° C. and 1200° C. for a time period ranging from 30 minutes to 120 minutes. By heating bonded wafer 41, at least two main effects are produced. First, heating of bonded wafer 41 further drives a bonding process of surfaces 17 and 44 to completion. It is believed that a chemical reaction takes place between surfaces 17 and 44, i.e., covalent bonding, when bonded wafer 41 is heated sufficiently. Second, heating of bonded wafer 41 diffuses implanted ions 33 and 34, as shown in FIG. 3, to form diffusion regions 46 and 47. More specifically, diffusion regions 46 are formed from implanted ions 33, whereas diffusion region 47 forms from implanted ions 34. It should be understood that diffusion 47 is formed from out diffusion of ions 34 in remaining layer 22.

In the case of the alternate embodiment of the present invention, wherein the remaining layer 22 is substituted for a photoresist masking layer. Diffusion region 47 is not formed, since the masking layer is removed along with the implanted ions, as previously described. However, since implanted ions 33 are still selectively implanted, as previously described, diffusion region 46 is still formed as shown.

Figure 5:
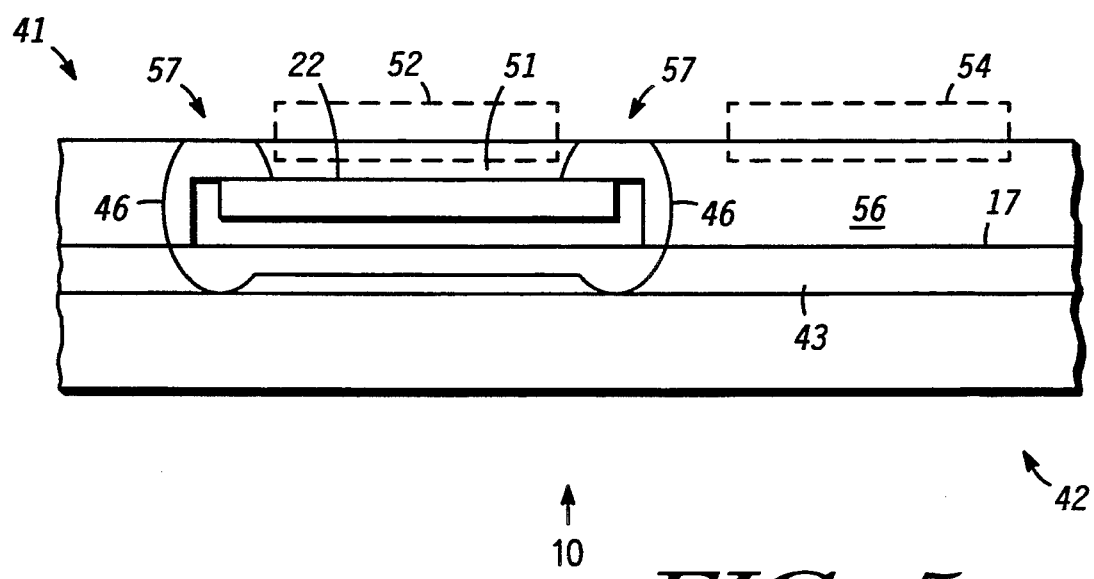
FIG. 5 is a simplified cross-sectional view of the first and second silicon substrates bonded together with the first silicon substrate partially removed in accordance with the present invention.

FIG. 5 is a cross-sectional view of bonded wafer 41 in which silicon substrate 10 is removed to a predetermined point. Generally, once the heat treatment has been achieved to bonded wafer 41, silicon substrate 10 of bonded wafer 41 is polished or lapped back to just below a top portion of diffusion region 46 by well known methods in the art, such as chemical-mechanical polishing, or the like. Typically, a thickness remaining after polish ranges from 5.0 microns to 10.0 microns as measured from above remaining layer 22 of dielectric material. Polishing back of silicon substrate 10 to just below a top portion of diffusion region 46 effectively isolates region 51 both vertically and laterally from region 56, thus allowing sensitive semiconductor devices, represented by box or dotted enclosure 52, to be located in close proximity to other semiconductor devices, represented by box or dotted enclosure 54, which otherwise would interfere with each other. Typically, dotted enclosure 52 represents a class of semiconductor devices called small signal devices which are either analog or digital devices. Vertical isolation is achieved by cavity 11 which is either partially filled with a dielectric or left empty, and lateral isolation is achieved by dopant barrier, represented by region 46. Further, it should be understood that when region 56 is actively connected to silicon substrate 42, region 56 is an electrically active area.

Additionally, by making semiconductor device 52 a digital or a small signal device which controls semiconductor device 54, then device 52 can control and operate power device 54 without interference from the electrical characteristics of power device 54.

By way of example, with bonded wafer 41 being fabricated as previously described in FIGS. 1-5, silicon substrate 10 is n-type with a sheet rho of approximately 2 ohms/cm$^2$ and silicon substrate 42 is prepared with layer 43 being of n-type silicon epitaxially deposited with a sheet rho of 2 ohms/cm$^2$ and silicon substrate 42 being of n-type with a sheet rho of approximately 0.001 ohms/cm$^2$. After thinning of substrate 10 to the predetermined distance, bonded wafer 41 is oxidized, thereby preferentially oxidizing exposed areas 57 of doped regions 46. By preferentially oxidizing exposed area 57, alignment guides or keys are formed, thus allowing accurate alignment of subsequent photolithography steps of bonded wafer 41.

By now it should be appreciated that a novel method using a unique combination of steps has been described for making an isolation for two semiconductor devices. The method allows for electrical isolation of a sensitive semiconductor device from a large electrically interfering semiconductor device, while permitting them both to be located on a single piece of silicon. Additionally, this method allows for an inexpensive process for combining both semiconductor devices.

We claim:

1. A method for making a power device and a small signal device on a silicon substrate comprising:

providing a first silicon substrate with a first surface and a second surface and having a first conductivity type;

etching the first surface on the first silicon substrate to form a cavity with a depth;

depositing an oxide layer on the first surface of the first silicon substrate in such a manner that the thickness of the oxide layer is less than or equal to the depth of the cavity;

patterning the oxide layer in such a manner that an island of oxide remains in the cavity that is smaller than the cavity, thereby exposing a portion of a bottom of the cavity;

masking the first silicon substrate, wherein the masking covers areas around the cavity, while the oxide island and the cavity are exposed;

implanting the first surface of the first silicon wafer with a dopant, wherein the dopant is implanted through the exposed areas of the masking, creating a second conductivity type in a perimeter of the cavity of the first silicon substrate;

providing a second silicon substrate with a first and a second surface;

bonding the first and the second silicon substrates together in such a manner that the first surface of the first silicon substrate is mated with the first surface of the second silicon substrate;

heating the mated first and second silicon substrates, thereby at least partially diffusing the dopant;

removing a portion of the first silicon substrate from the second surface; and completing a fabrication sequence for the small signal device and the power device, wherein the small signal device is positioned in the first silicon substrate over the oxide island and the power device is positioned over an active substrate area.

2. The method of claim 1 wherein the implanting is achieved by implanting a p-type dopant.

3. The method of claim 2 wherein the dopant is boron implanted with dose ranging from $10^{11}$ ions per square cm to $10^{19}$ ions per square cm.

4. The method of claim 2 further including oxidation of the first silicon substrate after removal of the predetermined portion of the first silicon substrate, thereby creating a preferential oxide growth.

5. A method for making a buried isolation layer for bonded silicon substrates comprising:

providing a first silicon substrate with a first and a second surface;

patterning the first surface of the first silicon substrate to form a plurality of cavities having a depth;

masking the resulting surface of the first silicon substrate, the masking covering a portion of the first surface and the masking covering a portion of the plurality of cavities, thereby exposing a portion of the first surface of the first silicon substrate and a portion of each cavity;

implanting the first surface of the first silicon substrate with a dopant, wherein the dopant is implanted through the exposed portion of the first surface of the first silicon substrate;

removing the masking;

providing a second silicon substrate with a first and second surface; and bonding the first surface of the first silicon substrate to the first surface of the second silicon substrate, thereby generating a bonded silicon substrate with the plurality of cavities therebetween.

6. The method of claim 5 further including forming a dielectric layer with a thickness less than or equal to the depth of the plurality of cavities on the first surface of the first silicon substrate and patterning the dielectric layer to form islands of dielectric in the plurality of cavities in the first surface of the first silicon substrate prior to bonding of the first and the second silicon substrates.

7. A method for making vertical and lateral isolations for a silicon bonded wafer comprising:

providing a first silicon substrate with a first surface and a second surface;

etching the first surface of the first silicon substrate to form a cavity with a depth;

masking the first silicon substrate with a mask, wherein the mask creates islands in the cavity that are smaller in size than the cavity, thereby exposing a portion of the first silicon substrate and covering surrounding surfaces around the cavity;

implanting ions into the exposed portion of the first silicon substrate; removing the mask;

providing a second silicon substrate with a first and a second surface;

bonding the first surface of the first silicon substrate and the first surface of the second silicon substrate together in such a manner that at least a portion of the implanted ions are diffused through a portion of the first silicon substrate creating a doped region; and removing a portion of the first silicon substrate from the second surface until at least a portion of the doped region is removed, thereby isolating a region between doped regions and the cavity.

8. The method of claim 7 wherein the etching of the cavity is accomplished by using a wet chemical etch.

9. The method of claim 7 wherein the mask is photoresist.

10. The method of claim 7 further including epitaxially growing a silicon layer on the first surface of the second substrate.

11. The method of claim 7 wherein the implanting is achieved by implanting a p-type dopant with a dose ranging from $10^{11}$ ions per square cm to $10^{19}$ ions per square cm.

12. The method of claim 7 wherein the removing of the portion of the second surface of the first silicon substrate is achieved by removing the second surface of the first silicon substrate to a range from 5.0 microns to 10.0 microns above the cavity.

13. The method of claim 7 wherein the removing of the predetermined portion of the second surface of the first silicon substrate is achieved by a chemical-mechanical polishing.

14. A method for making a first and a second device using a buried isolation layer with bonded substrates comprising the steps of:

providing a first substrate with a first and a second surface;

patterning the first surface of the first substrate to form a plurality of cavities having a depth;

forming a dielectric layer in the plurality of cavities, wherein the thickness of the dielectric layer is less than or equal to the depth of the plurality of cavities, and wherein the dielectric layer forms an island in each of the plurality of cavities;

masking the first surface of the first substrate with a masking layer that provides openings, wherein the openings expose the plurality of cavities, and wherein the masking layer covers portions of surrounding areas of the first surface of the first substrate;

providing a second substrate with a first and a second surface;

bonding the first surface of the first substrate to the first surface of the second substrate, thereby generating a bonded substrate; and completing a fabrication sequence for making a first device and a second device, wherein the first device is made over the dielectric layer and the second device is made adjacent to the dielectric layer.

15. A method for making a buried isolation layer for bonded silicon substrates as claimed in claim 5 wherein in the step of masking the first surface, the masking is an oxide.

16. A method for making a buried isolation layer for bonded silicon substrates as claimed in claim 5 wherein in the step of masking the first surface, the masking is a photoresist.

17. A method for making a buried isolation layer for bonded silicon substrates as claimed in claim 5 further comprising:

heating the mated first and second silicon substrates, thereby at least partially diffusing the dopant;

removing a portion of the first silicon substrate from the second surface; and completing a fabrication sequence for a first device and a second device, wherein the first device is positioned over the cavities of first silicon substrate and the second device is positioned over the active substrate area.

* * * * *